United States Patent
Frommer et al.

(10) Patent No.: US 7,489,483 B2
(45) Date of Patent: Feb. 10, 2009

(54) SYSTEM AND METHOD FOR LOOK AHEAD DETECTION OF ELECTRICAL PROBLEMS AT A MOTOR OF A VEHICLE

(75) Inventors: Thomas Frommer, Mount Albert (CA); Wasim Tahir, Scarborough (CA); Shashank Kumar Singh, Markham (CA); Jason Chinsen, Brantford (CA); Tomasz T. Dominik, Toronto (CA)

(73) Assignee: Flextronics Automotive Inc., Ontario (CA)

( * ) Notice: Subject to any disclaimer, the term of this patent is extended or adjusted under 35 U.S.C. 154(b) by 171 days.

(21) Appl. No.: 11/522,621

(22) Filed: Sep. 19, 2006

(65) Prior Publication Data

US 2008/0084229 A1  Apr. 10, 2008

(51) Int. Cl.
*H02H 7/08* (2006.01)
(52) U.S. Cl. .............. 361/23; 361/33; 361/31; 318/453; 318/455; 324/772
(58) Field of Classification Search ............ 318/400.04, 318/400.28, 400.33, 453, 455; 361/6, 23, 361/29, 30, 33, 31; 324/772
See application file for complete search history.

(56) References Cited

U.S. PATENT DOCUMENTS

| 4,300,085 A | 11/1981 | Monma et al. |
| 4,575,662 A * | 3/1986 | Lehnhoff ................. 318/282 |
| 5,039,925 A | 8/1991 | Schap |
| 5,285,139 A * | 2/1994 | Ogasawara ............... 318/466 |
| 5,945,802 A | 8/1999 | Konrad et al. |
| 6,597,552 B1 | 7/2003 | Griepentrog et al. |
| 7,072,199 B2 * | 7/2006 | Chen et al. ............. 318/400.29 |
| 2003/0115803 A1 | 6/2003 | Kidokoro |
| 2004/0145838 A1 | 7/2004 | Hazelton |
| 2004/0195916 A1* | 10/2004 | Katrak et al. .............. 307/4 |

FOREIGN PATENT DOCUMENTS

WO   WO/02/087812   11/2002

\* cited by examiner

*Primary Examiner*—Rita Leykin
(74) *Attorney, Agent, or Firm*—Patton Boggs LLP

(57) ABSTRACT

A system for sensing short circuits and open circuits prior to operation of a motor (i.e., while the motor is in a static state), thereby sparing the electrical system from destructive effects of these electrical problems. In addition, the system may detect a short circuit during operation of the motor (i.e., while the motor is in a dynamic state). Still yet, the system may detect an open circuit at the motor. The motor may be any electromechanical motor, such as a direct current (DC) motor, used in a vehicle or otherwise for controlling motion of a mechanical device.

18 Claims, 8 Drawing Sheets

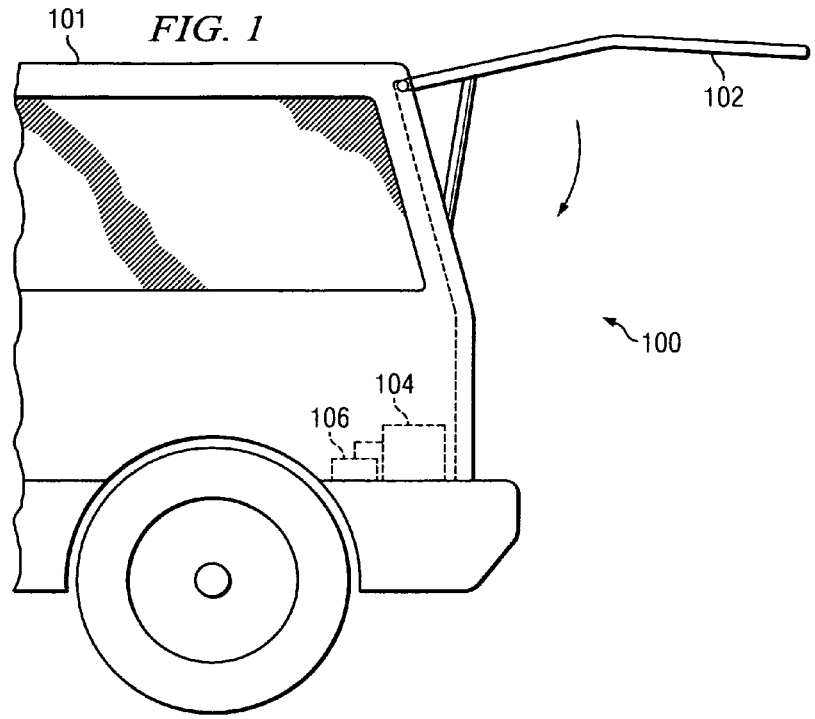
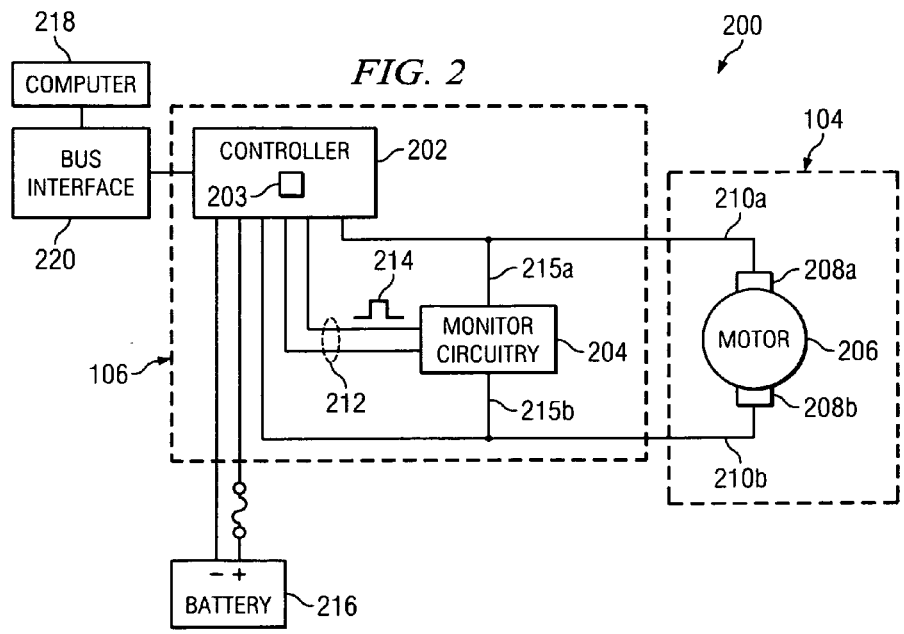

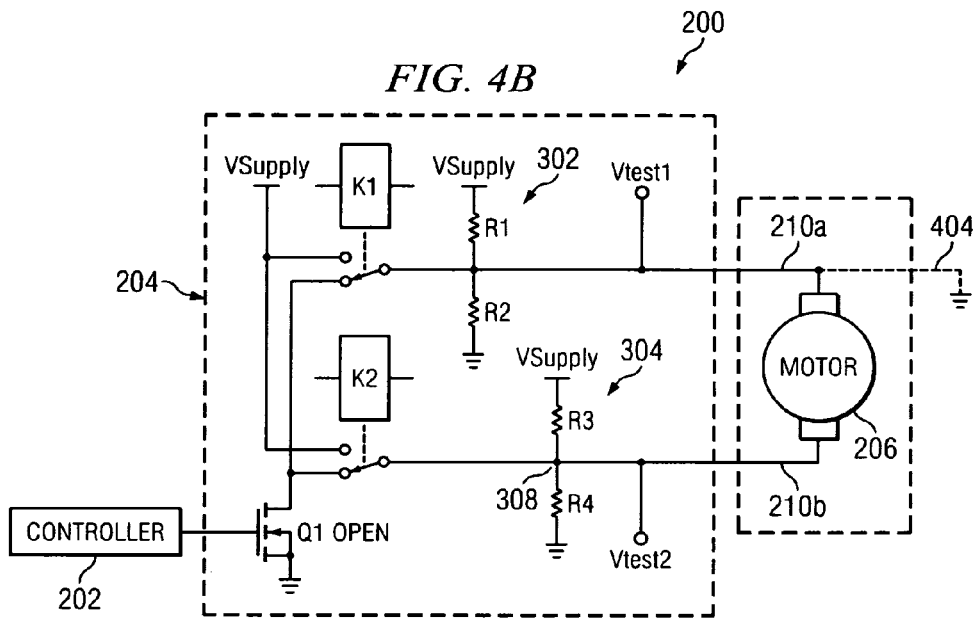
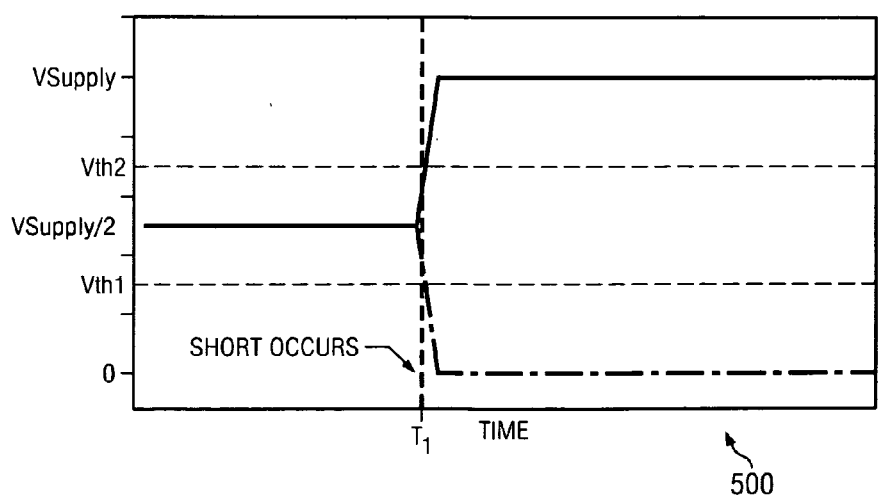

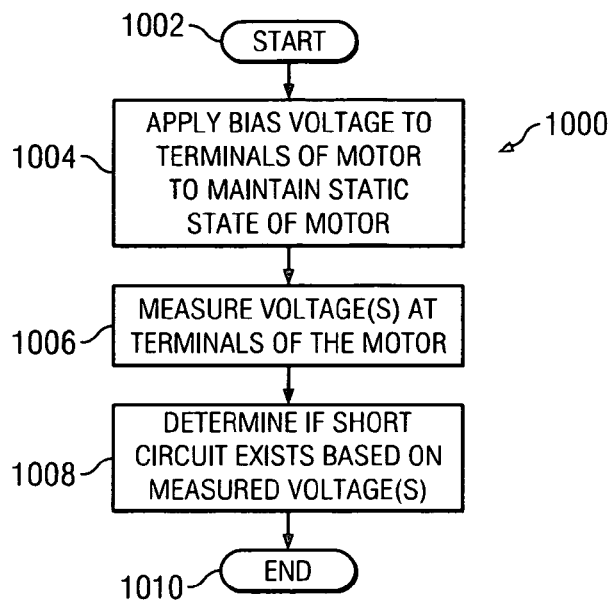
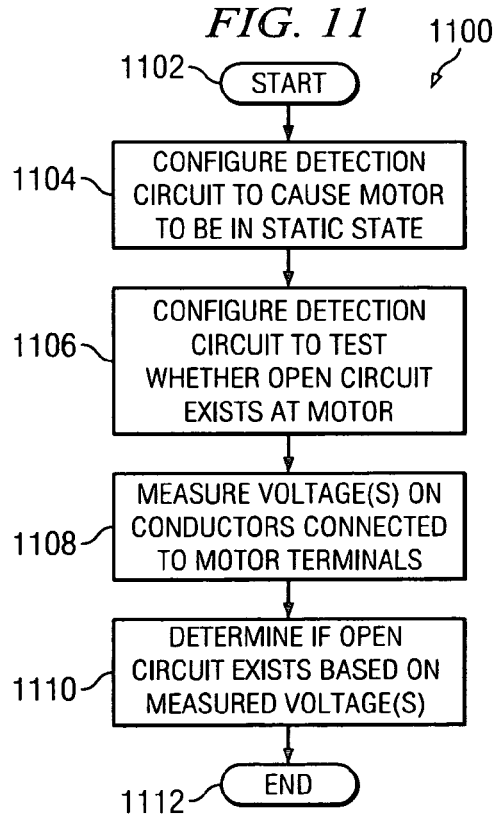
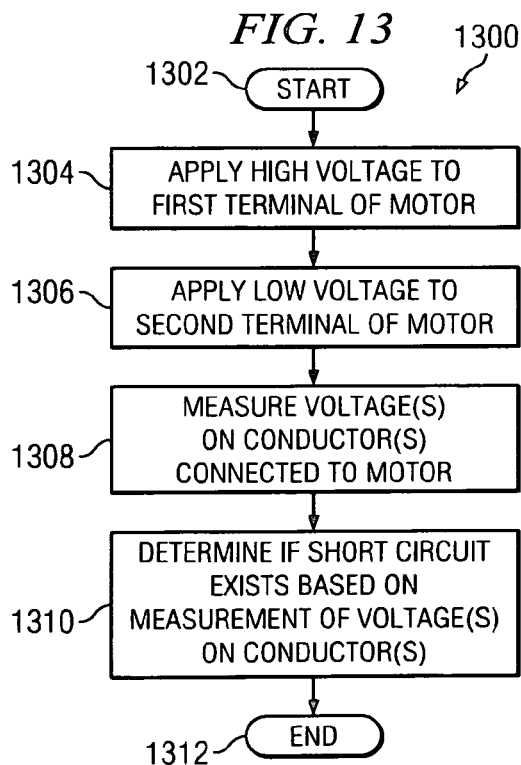

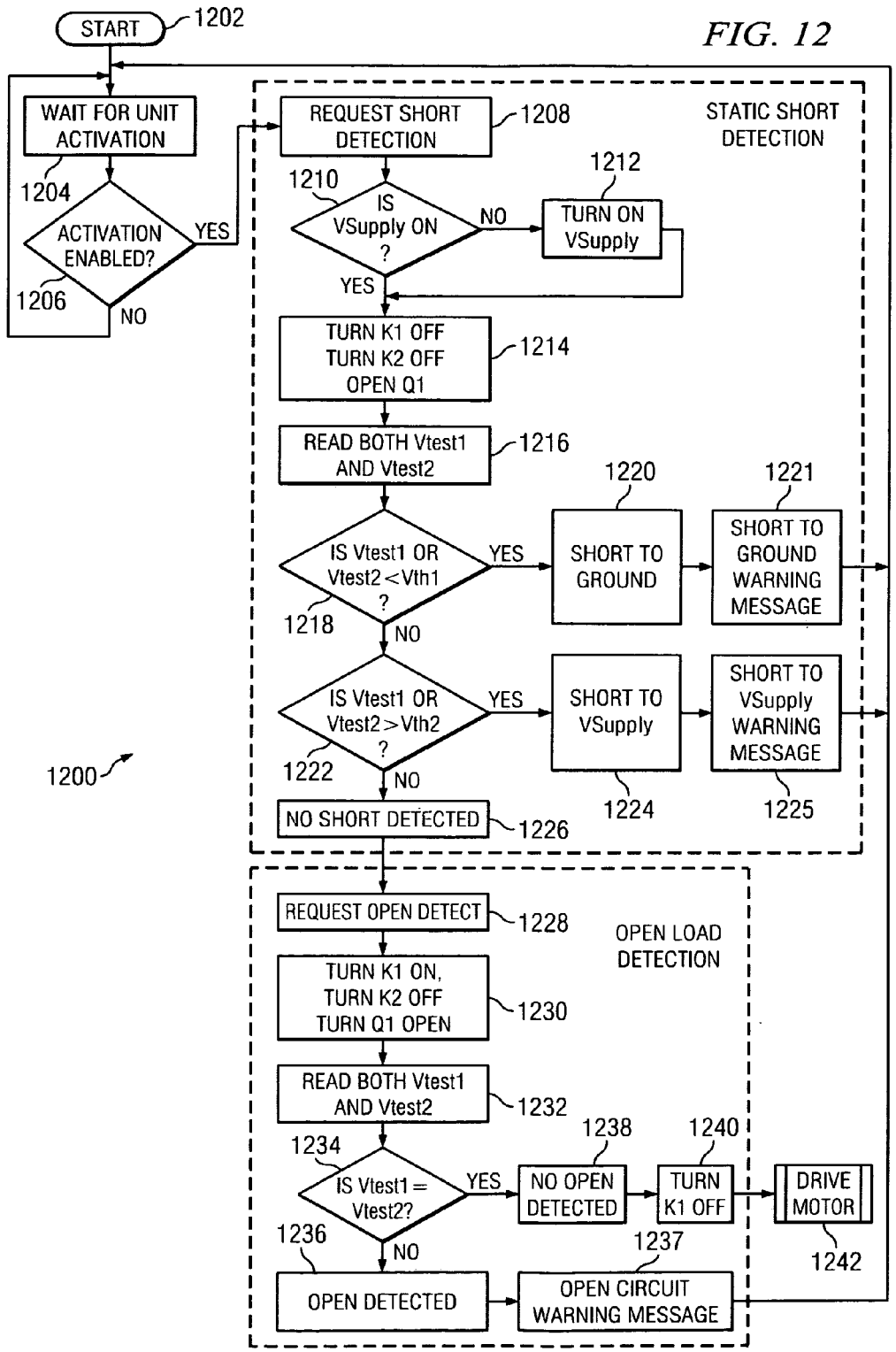

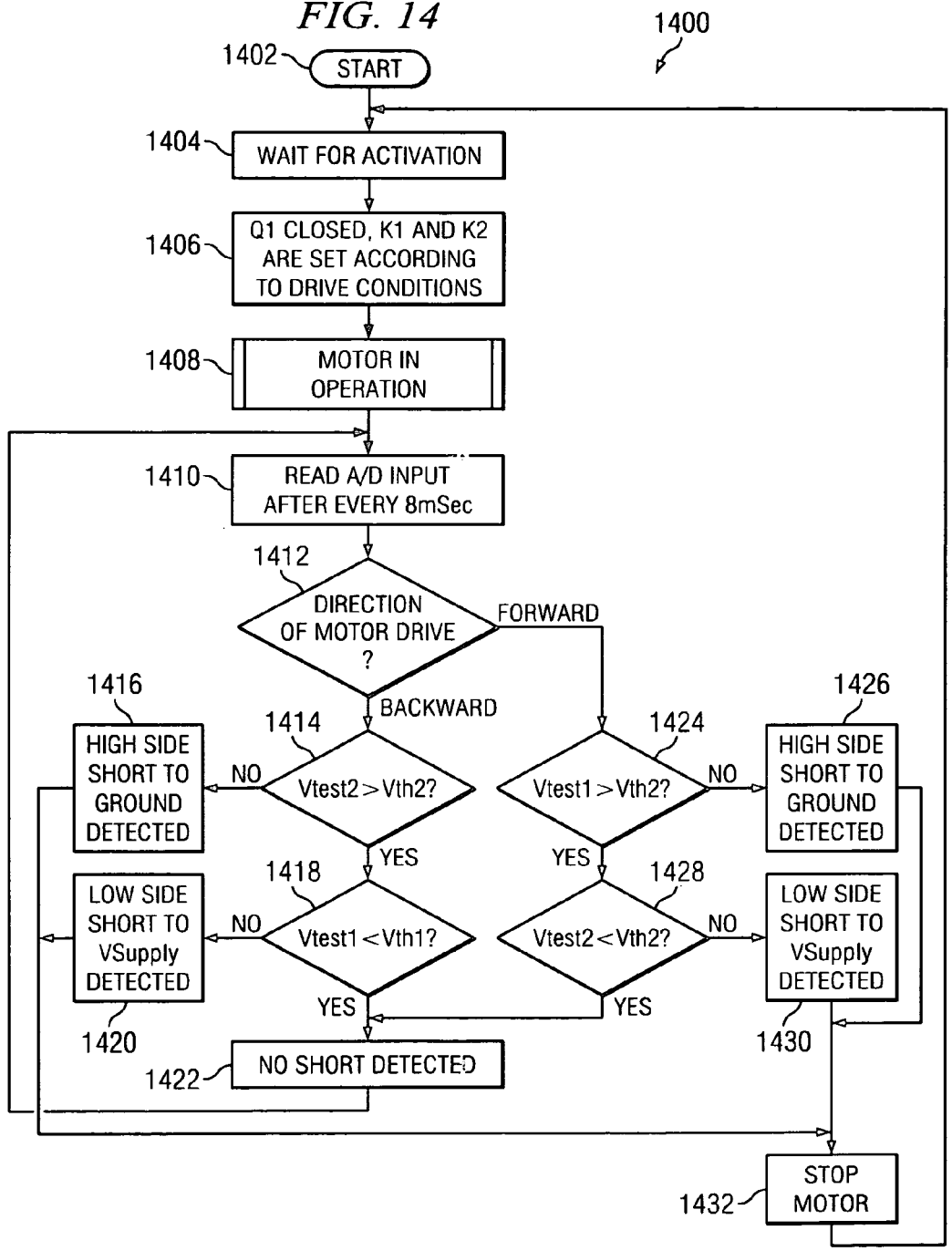

SYSTEM AND METHOD FOR LOOK AHEAD DETECTION OF ELECTRICAL PROBLEMS AT A MOTOR OF A VEHICLE

BACKGROUND

Vehicles, such as automobiles, have had various features automated over the recent past. These features, such as power seats and power doors (e.g., sliding doors and lift gates), utilize motors for moving the particular features. While these motors are beneficial in terms of aiding operators of the vehicles, this additional complexity of electrical systems may also be a hindrance to the operator, manufacturer, and technicians in terms of reliability and diagnostics, as the addition of the electrical components may result in short circuits and open circuits, as understood in the art. Electrical failures in vehicles tend to be problematic in diagnosing and fixing the failed components and/or wiring. Accordingly, there is a need for preventing electrical circuits and motors from being damaged due to an electrical problem, such as a short circuit, and to aid diagnostics for fixing the electrical problems.

SUMMARY

To overcome the problems of electrical problems in electrical systems that drive motors within vehicles, the principles of the present invention are directed to a system for sensing short circuits and open circuits prior to operation of a motor (i.e., while the motor is in a static state), thereby sparing the electrical system from destructive effects of these electrical problems. In addition, the principles of the present invention may be utilized to sense a short circuit during operation of the motor (i.e., while the motor is in a dynamic state). Still yet, the principles of the present invention provide for detecting an open circuit at the motor.

More specifically, the principles of the present invention may include a system including a motor having a first terminal and a second terminal. A test circuit may be connected to the first and second terminals of the motor and be configured to test whether an electrical problem exists at the motor. A processor may be in communication with the test circuit and be configured to determine whether an electrical problem exists at the motor.

An alternative embodiment in accordance with the principles of the present invention includes a circuit for determining whether an electrical problem exists at a motor having a pair of terminals. The circuit may include a first voltage divider circuit connected to a first terminal of the motor via a first conductor. A first test point may be disposed on the first conductor. An input line may be connected to the first voltage divider circuit to enable a first supply voltage to be applied to the first voltage divider circuit and cause a first test voltage to be applied to the first conductor. The first test voltage may be available at the first test point for measurement if a short circuit does not exist along the first conductor.

In yet another embodiment, a method for determining if an electrical problem exists in a motor of a vehicle may be utilized. The method may include applying a bias voltage to the terminals of the motor to maintain a static operation of the motor. At least one voltage applied to the terminals may be measured and a determination as to whether a short circuit exists based on the measured voltage(s). A supply voltage may be applied to one of the terminals and voltages on the terminals may be measured to determine if an open circuit exists.

Still yet, the principles of the present invention may include a method for determining if an electrical problem exists at a motor of a vehicle by applying a high voltage to a conductor connected to a first terminal of the motor. A low voltage may be applied to a conductor connected to a second terminal of the motor, where the high and low voltages being applied to the motor cause the motor to be in a dynamic state. Voltage(s) on the conductor(s) connected to the first and second terminals of the motor may be measured. A determination may be made to determine if a short circuit exists based on the measurement of the voltage(s) on the conductor(s).

BRIEF DESCRIPTION OF THE DRAWINGS

FIG. 1 is an illustration of an exemplary vehicle having a lift gate controlled by a motor;

FIG. 2 is a schematic block diagram of an exemplary control system for controlling a motor of a vehicle;

FIGS. 4A and 4B are schematics of exemplary configurations of the monitor circuit for detecting a short circuit at a motor;

FIG. 5 is a graph showing measurements made of a static short circuit by the monitor circuit;

FIG. 10 is a flow chart describing an exemplary process for determining if a static short circuit exists at a motor;

FIG. 11 is a flow chart describing an exemplary process for determining if an open circuit exists at the motor;

FIGS. 12 is a flow chart illustrating a more detailed process for determining if a static short circuit and an open circuit exists at the motor;

FIG. 13 is a flow chart describing an exemplary process for determining if a dynamic short circuit exists at the motor; and FIG. 14 is a flow chart of a more detailed exemplary process for determining if a dynamic short circuit exists.

DETAILED DESCRIPTION

Figure 3A:
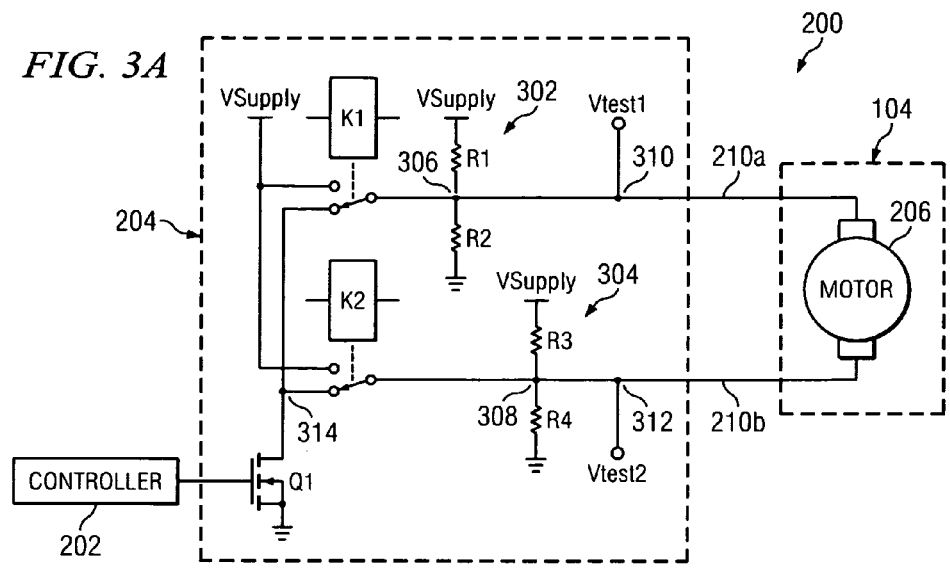
FIG. 3A is a schematic of an exemplary monitor circuit for monitoring static short circuits, open circuits, and dynamic short circuits.

FIG. 1 is an illustration of an exemplary vehicle 100 having a mechanical component, such as a lift gate 102, controlled by a motor. The vehicle 100 includes a vehicle body 101 and lift gate 102. The lift gate 102 is configured to be controlled by a motor unit 104 to open and close. The motor unit 104 may be electromechanical (e.g., motor and gears), hydraulic, or pneumatic, as understood in the art. A controller unit 106 may be in communication with the motor unit 104. The controller unit 106 may include a housing to house electronic components and is separate from the motor unit 104. Alternatively, the controller unit may be incorporated into a housing of the motor 106.

Although the motor unit 104 and controller unit 106 are shown to be used for controlling operation of the lift gate 102, it should be understood that the principles of the present invention apply to any motor that is utilized to control operation of a mechanical device of the vehicle 100. For example, the motor may be used to control positioning of a seat, steering wheel, mirror, antenna, windshield wiper, window, or any other device of the vehicle 100. Still yet, while the principles of the present invention are being described with regard to a motor vehicle, it should be understood that these same principles may be applied to motors other than those used on vehicles. For example, the principles of the present invention may be applied to motors used on boats, airplanes, buildings (e.g., automatic doors), or any other motor used for controlling operation of a mechanical device or structure. These principles may be applied to both direct current (DC) or alternating current (AC) motors, as well as coils where both terminals return to the microcontroller.

FIG. 2 is a schematic block diagram of an exemplary control system 200 for controlling a motor of a vehicle. The electronic system 200 includes the control unit 106 that includes a controller 202, which may composed of one or more processors or microcontrollers. The controller 202 may execute software 203 for performing the functionality of enabling an operator or passenger of the vehicle 100 (FIG. 1) to control the motor for operating the lift gate 102, for example. Although not shown, a switch, such as a push button switch or toggle switch, may be positioned within the vehicle for the operator to operate to cause the controller to command the motor to open or close the lift gate 102.

The controller unit 106 may further include monitor circuitry 204 for performing monitoring operations of the motor and associated circuitry to determine whether an electrical problem exists at motor 206. The monitor circuitry 204 may be configured to determine whether a short circuit exists in a static state or dynamic state of the motor 206. Further, the monitor circuitry 204 may monitor whether an open circuit exists at the motor 206 in a static state. The static and/or dynamic state testing may be performed in response to a user attempting to control a mechanical component. Alternatively, the testing may be in response to the vehicle being started. Still yet, the testing may occur at periodic or non-periodic times.

The motor 206 includes a first terminal 208a and a second terminal 208b (collectively 208) for enabling voltages to be applied for controlling speed and direction of the motor 206. A first conductor 210a and a second conductor 210b (collectively 210) are electrically connected to the first terminal 208a and second terminal 208b, respectively, and the controller 202. The monitor circuitry 204 is also connected to the first conductor 210a and second conductor 210b for monitoring whether or not an electrical problem exists at the motor 206. In terms of being "at the motor," any circuitry or electrical device connected to either of the conductors 210 or terminals 208, the conductors 208 and terminals 210 themselves, or the motor 206 itself is considered to be at the motor.

The software 203 executed by the controller 202 may also include software that operates in conjunction with the monitor circuitry 204. A controller bus 212 may be connected between the controller 202 and monitor circuitry 204. The controller bus 212 enables communication of control signals 214 between the controller 202 and the monitor circuitry 204. One or more control signals 214 may include one or more signals to turn on and off switches controlled within the controller 202. Additionally, the monitor circuitry 204 may be connected to conductors 215a and 215b that are used to sense the voltages on the first conductor 210a and second conductor 210b, respectively. It should be understood that the control signals 214 may be digital or analog in accordance with the monitor circuitry 204. In one embodiment, the controller 202 includes analog input ports. Alternatively, an analog-to-digital (A/D) conversion device (not shown) may be utilized in conjunction with the controller 202. Still yet, the monitor circuitry may include an A/D conversion device to communicate over the controller bus 212.

To power the electrical system 200, including the control unit 106, a battery 216 of the vehicle may be connected to one or more components of the electrical system 200. In normal operation, the battery 216 is utilized to power (i.e., enable and disable) the motor 206 as understood in the art. A bus interface 220 linking the computer 218 with the controller 202 may be utilized to deliver various signals between the devices. These signals may be analog and/or digital signals.

FIG. 3A is a schematic of an exemplary monitor circuit for monitoring static short circuits and dynamic open and short circuits. Consistent with FIG. 2, the monitor circuitry 204 is connected to the motor 206 via the conductors 210. A first voltage divider 302 is connected to the first conductor 210a and second voltage divider 304 is connected to the second conductor 210b. In one embodiment, the first voltage divider 302 contains two resistors R1 and R2, connected to opposite sides of node 306 on the first conductor 210a. A supply voltage Vsupply is connected on the opposite side of resistor R1 from the node 306, and ground G is connected on the opposite side from the node 306 of resistor R2. Similarly, the second voltage divider 304 has resistors R3 and R4 connected on opposite sides of node 308 where a voltage supply Vsupply is connected to the opposite side of the resistor R3 with respect to the node 308 and ground G is connected at the opposite side of resistor R4 from the node 308. In one embodiment, each of the resistors R1-R4 have equivalent resistance values, such that bias voltages applied to each of the nodes 306 and 308 are equivalent, thereby enabling detection of a difference between the voltages on the first and second conductors 210 occur during testing by the monitor circuitry 204.

In determining the voltages on the first and second conductors 210 are during testing, test points Vtest1 and Vtest2 are located at the first conductor 210a and second conductor 210b at nodes 310 and 312, respectively. These test points may be "electrically connected" to the controller 202, where being electrically connected means a direct or indirect connection to the controller 202, such that the controller 202 is capable of determining voltage levels at nodes 310 and 312.

The monitor circuitry 204 further includes a pair of switches, K1 and K2, and a third switch Q1. The pair of switches, K1 and K2, may be electromechanical switches connected to the controller 202 via the controller bus 212 of FIG. 2 (not shown in FIG. 3A). The switches K1 and K2 are configured to apply a supply voltage Vsupply to one or both of the conductors 210, separately or simultaneously, connect the first and second conductors 210 together by floating node 314 by turning off switch Q1, or apply ground to one or both of the conductors 210 by turning on switch Q1. It should be understood that other configurations and/or other components may be utilized to perform the same or similar functionality in accordance with the principles of the present invention.

The configuration of the monitor circuitry enables static and dynamic short testing at the motor 206 and dynamic open load testing as well, as further described herein. It should be understood that alternative embodiments of the monitor circuitry 204 may be utilized to perform the same or functional equivalent testing of the circuitry of the motor. Still yet, alternative electrical components may be utilized and/or different values of the electrical components may be used in accordance with the principles of the present invention.

Figure 3B:
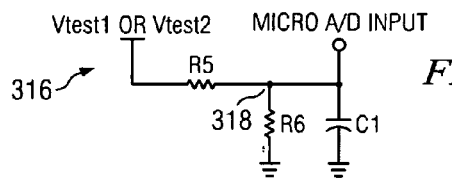
FIG. 3B is a schematic of a voltage divider used for an analog-to-digital input of a microcontroller.

FIG. 3B is a schematic of a voltage divider 316 used for an analog-to-digital input of a controller, such as a controller 202 (FIG. 2). The voltage divider 316 includes resistors R5 and R6 connected at node 318. The voltage divider 316 may be circuitry used to connect the voltage test point Vtest1 and voltage test point Vtest2 to A/D input port of the controller 202 (FIG. 3A). A capacitor C1 may also be coupled to the node 318 for decoupling or filtering purposes, as understood in the art.

Continuing with FIG. 3A, the monitor circuitry 204 may be used to test for short circuits and open circuits at the motor 206. Short circuit testing is divided into two separate test conditions, static and dynamic. Static testing refers to a look-ahead method (i.e., prior to activating the motor). Dynamic short circuit testing diagnoses a failure at the motor during motor operation, and relies on a current, voltage bias resistor network, and motor speed sensing feedback, where available. Open load detection is also possible during static testing utilizing the circuitry shown in FIG. 3A.

The look-ahead, static short circuit testing allows the controller 202 to identify a short circuit to a supply voltage or ground prior to activation of a drive circuit (e.g., controller 202 of FIG. 2) and motor 206. As a result, this short circuit testing protects the electrical system 200 from potentially harmful and destructive effects of a short circuit.

Figure 4A:
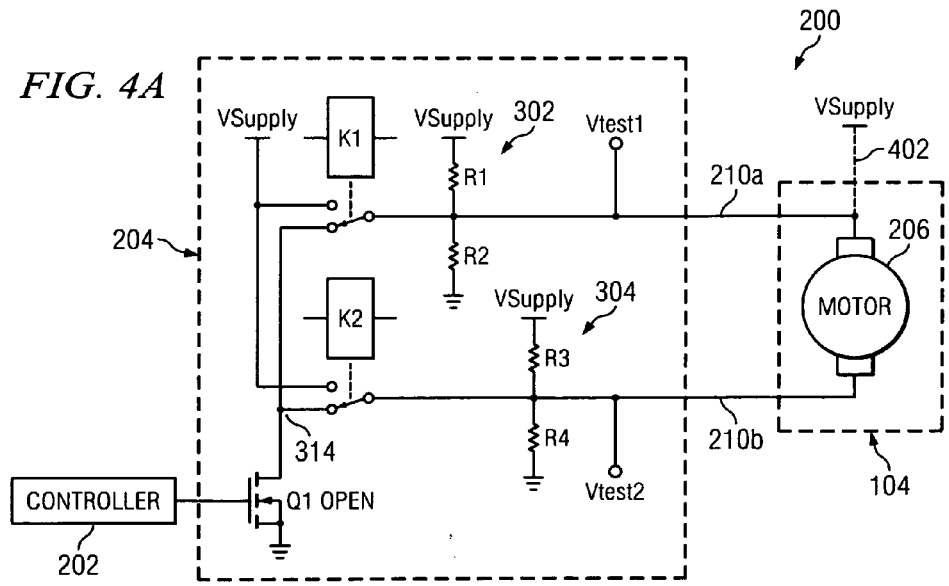

FIGS. 4A and 4B are schematics of exemplary configurations of the monitor circuitry 204 for detecting a short circuit at a motor. As shown, each of the switches K1 and K2 are off, thereby electrically connecting the conductors 210a and 210b at node 314. Additionally, the switch Q1 is opened, which causes the conductors 210a and 210b to float. By floating the conductors, the voltage dividers 302 and 304 cause the voltage on each of the conductors 210a and 210b to be at the same voltage level. As discussed previously, if each of the resistors R1, R2, R3 and R4 are equal, then the voltage level on each of the conductors 210a and 210b are equal to Vsupply/2. It should be understood, however, that alternative resistor values may be utilized in accordance with the principles of the present invention. In one embodiment, the voltage supply Vsupply being delivered to the voltage dividers 302 and 304 may be different. A voltage threshold may be established for comparison purposes to determine if either of the first or second conductor 210a or 210b has a short circuit. In the case of the voltage supplies being different for each voltage divider 302 and 304, the controller 202 may be configured to use the different voltage supply levels and an appropriate voltage threshold may be calculated. The voltage threshold may be one or more values (e.g., center value with a range value) stored in a memory location accessible to the controller 202 and utilized during testing by the software 203 (FIG. 2). For example, a voltage threshold of Vsupply/2±0.5 volts may be utilized. If either of the conductors 210a or 210b has a short circuit to Vsupply or ground, then a measurement at Vtest1 or Vtest2 is outside of the threshold and a determination is made that a short circuit at the motor 206 exists.

Continuing with FIG. 4A, an exemplary short circuit to Vsupply is shown by dashed-line 402. If the short circuit to Vsupply exists, then the controller 202 determines that Vtest (e.g., Vtest1 and/or Vtest2) is high and outside the voltage threshold, rather than Vsupply/2 (i.e., the bias voltage) as shown on FIG. 5.

Referring to FIG. 4B, as shown, the configuration of the switches are the same as those in FIG. 4A, where the switches K1 and K2 are off and the switch Q1 is open, thereby floating the conductors 210a and 210b. In this scenario, if a short to ground, represented by the dashed-line 404 exists, the short to ground is detected by the controller 202 as the test points Vtest1 and/or Vtest2, being at a low voltage, are outside the normal or bias voltage threshold. The detection is shown on FIG. 5 at time T1 as the voltage drops to 0 volts from Vsupply/2. In order to prevent the static short from interfering with normal motor operation, the values of R1-R4 should be high enough to minimize the flow of current to ground through them. The short circuit can be determined upon the voltage at Vtest1 or Vtest2 crossing either threshold voltage Vth1 (short to ground) or Vth2 (short to Vsupply).

Figure 6A:
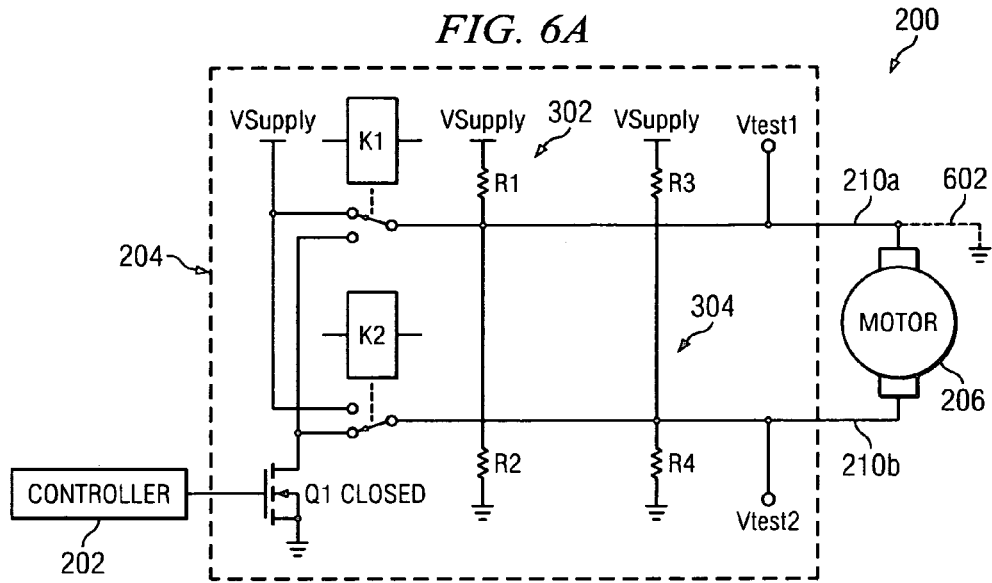
FIGS. 6A and 6B are schematics of exemplary configurations of the monitor circuit for detecting a short circuit during dynamic operation of a motor.
Figure 6B:
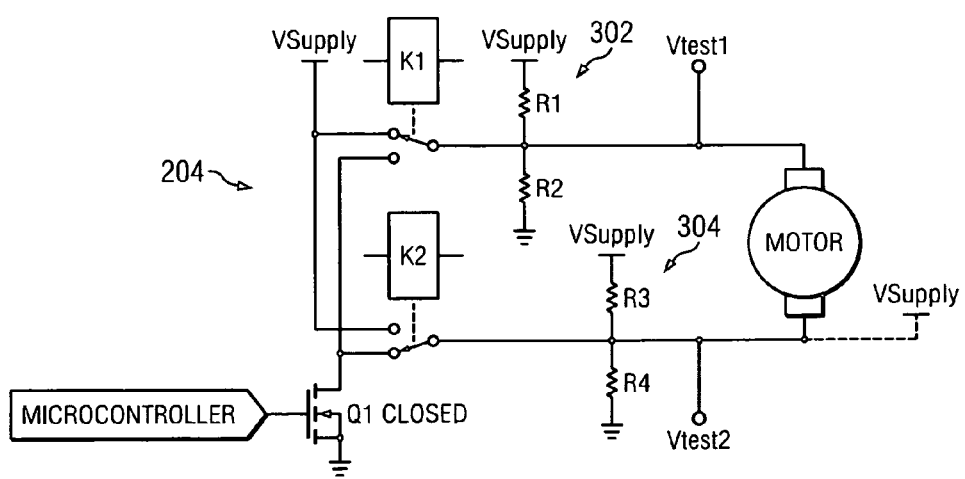

FIGS. 6A and 6B are schematics of exemplary configurations of the monitor circuitry 204 for detecting a short circuit during dynamic operation of a motor. The electrical testing during the dynamic testing configuration includes testing for short circuits on both the high side (positive terminal) and the low side (negative or ground terminal) of the motor 206.

Referring to FIG. 6A, the monitor circuitry 204 may be configured by the controller 202 to test for a short circuit-to-ground on the high side of the motor 206 (i.e., on conductor 210a). The configuration includes switch K1 being turned on, such that conductor 210a is connected to Vsupply, switch K2 remains off, and switch Q1 is closed, such that conductor 210b is connected to ground through switch Q1. If a short circuit, represented as dashed line 602 occurs on the high side of the motor 206, the controller 202 is able to measure a low voltage at test point Vtest1. By isolating the conductors 210a and 210b, by configuring the switches K1 and K2 in opposite directions and turning on (i.e., closing) switch Q1, the differential voltage across the motor causes the motor 206 to be in operation. A threshold voltage may be established to enable the controller 202 to determine that the voltage level on conductor 210a is below the threshold.

Referring to FIG. 6B, if a short circuit occurs to Vsupply on the low side of the motor 206, represented by dashed-line 604, then the processor 202 determines that the voltage measured as test point Vtest2 is high.

Figure 7:
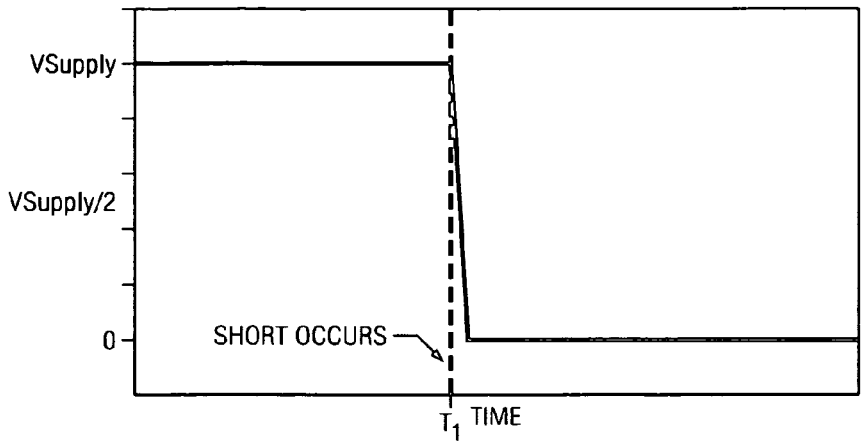
FIG. 7 is a graph of an exemplary signal representative of a dynamic short circuit detection.

FIG. 7 is a graph of an exemplary signal representative of a dynamic short circuit detection, such as that performed by the configurations of FIGS. 6A and 6B. The graph shows a graphical representation of the voltage measured at test point Vtest1 in the event of a short circuit to ground during dynamic testing of the motor 202 (FIG. 6A). As shown, when the short circuit occurs on conductor 210a at time $T_1$, upon a switch K1 being switched to Vsupply or switch Q1 being turned on, for example, the voltage drops below a system dependent voltage threshold Vthreshold (not shown in FIG. 7). In one embodiment, and as shown in FIG. 7, the voltage drops from Vsupply to zero volts. However, in the dynamic condition, a short to ground does not necessarily mean that the voltage drops to zero. Depending on the nature of the short to ground, the voltage drops to a value below a system dependent Vthreshold, and may be above or below Vsupply/2 as well as zero volts. This system dependent threshold may be programmed into the controller depending on the limitations imposed by the system. The occurrence of the short circuit at time $T_1$ may be caused by any number of events after switch K1 is turned on and voltage Vsupply is applied to the first conductor 210a. For example, the event may be turning on switch Q1 if a short circuit exists at the motor 206 causing ground to be applied to conductor 210a. For example, the short circuit may exist in the motor itself.

Figure 8:
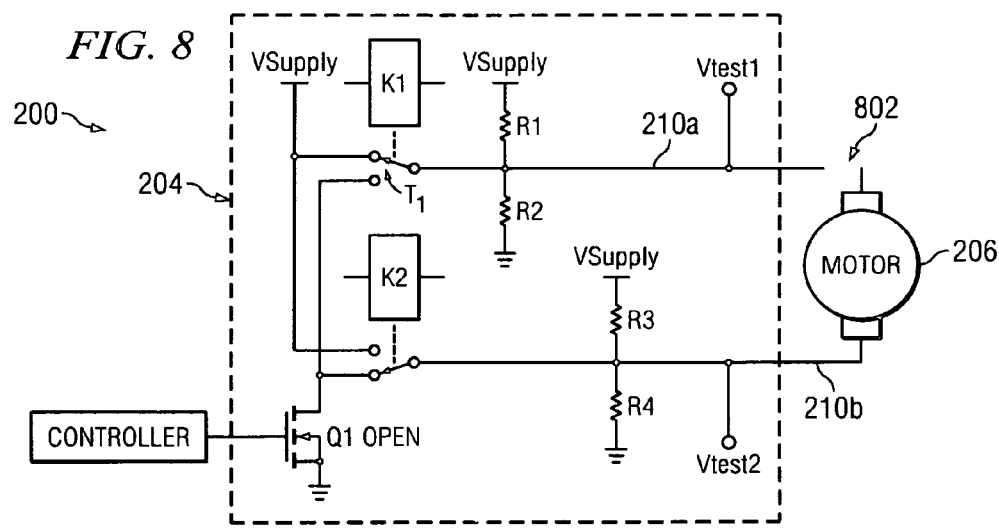
FIG. 8 is a schematic of an exemplary configuration of the monitor circuit for detecting an open at a motor.

FIG. 8 is a schematic of an exemplary configuration for detecting an open circuit at a motor. The configuration of the monitor circuitry 204 starts with both K1 and K2 open to bias the conductors 210a and 210b are biased to Vsupply/2. At time T1, switch K1 is switched on so that the supply is applied to the conductor 210a and switch K2 remains off. Switch Q1 remains open. In this scenario, the voltage measured at test points Vtest1 and Vtest2 prior to time T1 should be the same. However, after time T1, in the event of an open circuit at the motor, as shown on the conductor 210a as an open circuit 802, the voltage at Vtest1 is Vsupply, while the voltage at Vtest2 is Vsupply/2.

As further explanation of the operation, assuming that switch K1 is switched to Vsupply, switch K2 remains off, and switch Q1 is open, due to the low resistance of the motor, the voltage dropped across the motor is minimal, thereby acting as a short and connecting Vtest1 and Vtest2. If there is no open circuit, then both Vtest1 and Vtest2 should read as Vsupply. If there is an open circuit, then Vtest1 and Vtest2 are isolated from each other and Vtest1 will read Vsupply and Vtest2 will read Vsupply/2.

Figure 9:
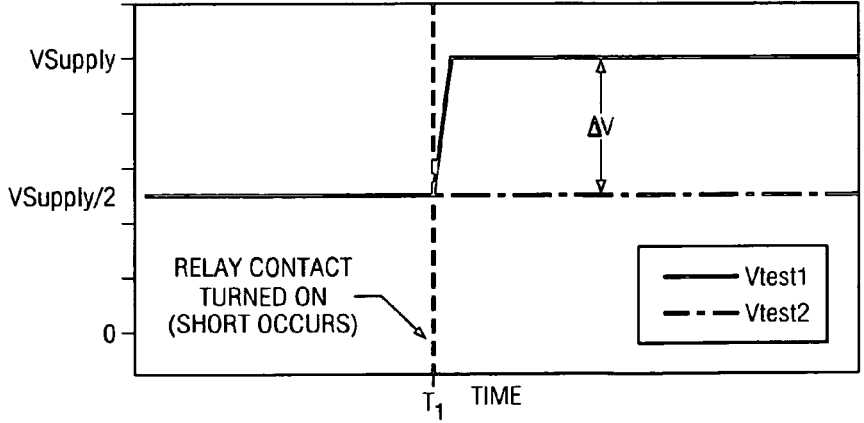
FIG. 9 is a graph of an exemplary signal for indicating an open load at a motor.

FIG. 9 is a graph of an exemplary signal for indicating an open circuit at a motor 206, thereby causing the motor to appear as an open load. As shown, prior to the open load detection test, the voltages on the conductors 210a and 210b are at Vsupply/2. However, when switch K1 switches high at time T1, the voltage at voltage test point Vtest1 switches high as Vsupply is placed onto conductor 210a and Vtest2 remains at Vsupply/2 because of the open circuit on conductor 210a. A voltage difference ΔV of Vsupply and Vsupply/2 is measured between Vtest1 and Vtest2 by a processor, for example, thereby indicating that an open circuit exists.

FIG. 10 is a flow chart describing an exemplary process for determining if a short circuit exists at a motor 206 prior to turning on or activating the motor. The process starts at step 1002. At step 1004, a bias voltage is applied to terminals of a motor to maintain the static state of the motor. As long as switch Q1 is open, the motor is in a static state, not operational. Voltages may be applied to the motor for diagnostics. Voltage(s) are measured at the terminals of the motor at step 1006. It should be understood that measuring voltage(s) at the terminals may include measuring test points on one or both conductors connected to the terminals of the motor. At step 1008, a determination is made if a short circuit exists based on the measured voltage(s). The process ends at step 1010.

FIG. 11 is a flow chart describing an exemplary process for determining if an open circuit exists at the motor prior to activating the motor. The process starts at step 1102. At step 1104, a detection circuit is configured to cause the motor to be in a static state. Again, as long as switch Q1 is open, the motor is in a static state and is not operational. This configuration may include initially turning both switches K1 and K2 off and opening switch Q1 (FIG. 4A). This configuration may thereafter include switching switch K1 to apply Vsupply to the conductor 210a (FIG. 8). Voltage(s) are measured on conductors connected to motor terminals at step 1106. At step 1108, a determination is made if an open circuit exists based on the measured voltage(s). The determination may include determining the difference between the voltages at the test points Vtest1 and Vtest2. The process ends at step 1110.

FIG. 12 is a flow chart illustrating a more detailed process for determining if a short circuit and/or an open circuit exists at the motor. The process may be implemented in software executed by a controller (e.g., software 203 executed by controller 202 of FIG. 2) or be configured in hardware or otherwise as understood in the art. The process starts at step 1202. At step 1204, the process waits for activation of electronic system (e.g., a driver toggling a mechanical switch) for controlling a motor (e.g., driver's seat). The process continues at step 1206, whereby the process determines if activation of the motor is requested. If not, the process continues to wait at step 1204 and repeat through step 1206. Upon determining activation at step 1206 in response to a request by an operator or passenger of a vehicle, a short circuit static test is initiated. At step 1208, a request to perform a short circuit detection is made. A determination as to whether a voltage supply Vsupply for powering monitor circuitry is turned on is performed at step 1210. If not, then the voltage supply Vsupply is turned on at step 1212. Otherwise, the process continues at step 1214, where switches K1 and K2 are confirmed to be off and switch Q1 is confirmed to be open to cause conductors connected to the motor to float and be applied a bias voltage by voltage dividers 302 and 304 (FIG. 3A).

At step 1216, voltages at test points Vtest1 and Vtest2 may be read. If either of the voltages measured at test points Vtest1 or Vtest2 is less than a voltage threshold (e.g., Vsupply/2+/−0.5 volts), then a determination is made that there is a short circuit to ground at step 1220. A short circuit to GND warning message is generated at step 1221 in the form of an audio or visual indicator, for example. If, at step 1218, it is determined that the voltage level measured at Vtest1 or Vtest2 is not less than the first voltage threshold, then a determination is made at step 1222 whether a voltage level measured at test point Vtest1 or Vtest2 is greater than a second voltage threshold (e.g., Vsupply/2+/−0.5 volt). If so, then a determination is made that a voltage level measured at test point Vtest1 or Vtest2 is short circuited to the supply voltage Vsupply at step 1224. A short circuit to Vsupply warning message may be generated at step 1225. If a short circuit to ground or Vsupply is determined at either step 1220 or 1224, then the process continues back at step 1204. If it is determined that neither voltage measured at Vtest1 and Vtest2 is below or above the first or second voltage thresholds, then it is determined at step 1226 that no short circuit is detected.

If no short circuit is detected, then the process may continue at step 1228, where a request to determine if an open circuit exists at the motor is made. At step 1230, the software causes a processor to configure monitor circuitry to be set up for the open load detection test. This configuration may include biasing voltages on conductors to the motor to be at Vsupply/2 or otherwise. In accordance with the monitor circuitry 204 of FIG. 8, switch K1 is turned on, switch K2 is turned off, and Q1 is opened. Test points Vtest1 and Vtest2 may be measured at step 1232.

At step 1234, a determination is made as to whether the voltage levels on test points Vtest1 and Vtest 2 are equal. If the voltage levels on test points Vtest1 and Vtest2 are not equal, then the process continues at step 1236, where it is determined that an open circuit exists. A warning message notifying of an open circuit may be generated at step 1237. The process continues at step 1204. Alternatively, if the voltage levels on the test points are equal, then it is determined that no open circuits are detected at step 1238. At step 1240, switch Q1 is turned on and the motor is driven as requested by the operator or passenger at step 1242.

FIG. 13 is a flow chart describing an exemplary process for determining if a dynamic short circuit exists at the motor. The process starts at step 1302. At step 1304, a high voltage is applied to the first terminal of the motor. The high voltage may be Vsupply or any other voltage level for use in performing a dynamic short circuit test. The high voltage may be Vsupply or any other voltage level for use in driving the motor. At step 1306, Q1 is closed to apply a low voltage (e.g., ground) may be applied to a second terminal of the motor to drive the motor. Voltage(s) may be measured on conductors connected to the motor. At step 1310, a determination if a short circuit exists at the motor may be made based on a measurement of voltage(s) on conductor(s). The process ends at step 1312.

FIG. 14 is a flow chart of a more detailed exemplary process for determining if a dynamic short circuit exists. The dynamic short circuit detection process starts at step 1402. At step 1404, the process waits for an activation of the motor. At step 1406, the process configures the monitor circuitry 204. The monitor circuitry 204 may include drive circuitry for driving the motor. In one embodiment, a controller executing the process configures the switches in the monitor circuitry 204 according to drive conditions for the motor to be in a dynamic state. Also, switch K1 may be turned on such that Vsupply is applied to conductor 210*a*, K2 is switched off and Q1 is closed, so that conductor 210*b* is applied to ground. This configuration causes the system to be in a drive or dynamic condition. The motor is in operation at step 1408 in response to the monitor circuitry 204 being configured in accordance with drive conditions.

At step 1410, the controller 202 (FIG. 2), executing the software 203, performing the process 1400, may read an analog-to-digital input. In one embodiment, the input is read every 8 milliseconds. At step 1412, a determination is made as to the direction of the motor drive. If the motor drive is backward, then at step 1414, a determination is made as to whether a voltage at voltage test point Vtest2 is greater than a voltage threshold Vth2. If the voltage level at Vtest2 is not greater than the voltage threshold Vth2, then a determination is made that there is a short circuit on the high side of the motor to ground at step 1416. If it is determined at step 1414 that the voltage level at test point Vtest2 is greater than the voltage threshold Vth2, then the process continues at step 1418, where a determination is made as to whether the voltage level at test point Vtest1 is less than voltage threshold level Vth1. If not, then a determination is made that a short circuit to Vsupply is detected at the low side of a motor. If at step 1418 it is determined that the voltage level at the test point Vtest1 is less than the voltage threshold Vth1, then the process continues at step 1422, where it is determined that no short circuit is detected.

Continuing from step 1412, if it is determined that the direction of the motor drive is forward, then at step 1424, a determination is made as to whether a voltage level at test point Vtest1 is greater than the voltage threshold Vth1. If not, then at step 1426, it is determined that a short circuit to ground exists at the high side of the motor. Alternatively, if at step 1424 it is determined that the voltage level at test point Vtest1 is greater than the voltage threshold Vth1, then the process continues at step 1428, where a determination is made if a voltage level at test point Vtest2 is less than the voltage threshold Vth2. If not, then at step 1430, a determination is made that a short circuit to Vsupply exists on the low side of the motor. Alternatively, if at step 1428 it is determined that the voltage level at test point Vtest2 is less than the voltage threshold Vth2, then the process continues at step 1422, where it is determined that no short circuit has been detected. If a short circuit has been detected at steps 1416, 1420, 1426, or 1430, then the process stops the motor at step 1432. If possible (e.g., if the dynamic short circuit clears), the process repeats at step 1404.

The previous detailed description is of a small number of embodiments for implementing the invention is not intended to be limiting in scope. One of skill in this art will immediately envisage the methods and variations used to implement this invention in other areas than those described in detail. The following claims set forth a number of the embodiments of the invention disclosed with greater particularity.

The invention claimed is:

1. A circuit for determining an electrical problem at a motor, said circuit comprising:
a first voltage divider circuit connected to a first terminal of the motor via a first conductor;
a first test point disposed on the first conductor;
an input line connected to said first voltage divider circuit to enable a first supply voltage to be applied to said first voltage divider circuit and cause a first test voltage to be applied to the first conductor, the first test voltage being available at said first test point for measurement if a short circuit does not exist along the first conductor;
a second voltage divider circuit connected to a second terminal of the motor via a second conductor;
a second test point disposed on the second conductor;
an input line connected to said second divider circuit to enable a second supply voltage to be applied to said second voltage divider circuit and cause a second test voltage to be applied to the second conductor, the second test voltage being available at said second test point for measurement if a short circuit does not exist along the conductor;
a pair of switches connected at a common terminal to the first and second conductors, respectively, said pair of switches each having a first and second selectable terminal, a first voltage source conductor connected to the first selectable terminals of said pair of switches;
a third switch connected to the second selectable terminals;
a second voltage source conductor connected to one side of said third switch, said third switch selectability being switched to apply a voltage on said second voltage source conductor to the second selectable terminals.

2. The circuit according to claim 1, wherein the first and second terminals of the motor are electrically coupled when said third switch is in an open state and said pair of switches ate in an off state.

3. The circuit according to claim 1, further comprising a processor in communication with said pair of switches, said third switch, and executing a software program to cause said pair of switches and third switch to be in states to enable said processor to measure voltages at at least one of said first and second test points to determine if an electrical problem exists at the terminals of the motor.

4. The circuit according to claim 3, wherein the states of said pair of switches and third switch cause the motor to be in a static state and said processor determines if a short circuit exists at either of the terminals by measuring at least one test voltage at said first and second test points.

5. The circuit according to claim 3, wherein said processor is further configured to configure said pair of switches and third switch to determine if an open circuit exists at the motor.

6. The circuit according to claim 3, wherein the states of said pair of switches and third switch cause the motor to be in a dynamic state and said processor determines if a short circuit exists at either of the terminals by measuring voltages at said first and second test points.

7. The circuit according to claim 3, wherein the software is configured to receive a motor activation signal and measure at least one of the test points before activating the motor.

8. The circuit according to claim 1, wherein said first and second voltage dividers each include a pair of resistors having the same values and the first and second supply voltages are the same.

9. The circuit according to claim 8, wherein the pair of resistors include resistors having different value.

10. A method for determining if an electrical problem exists at a motor of a vehicle, said method comprising:
prior to activation of a motor, applying a bias voltage to terminals of the motor to maintain a static state of the motor;
measuring at least one voltage being applied to the terminals of the motor; and determining if a short circuit exists at the motor based on said at least one measured voltage.

11. The method according to claim 10, further comprising:
after determining if a short circuit exists while the motor is in the static state, applying a first voltage on a first terminal of the motor and a second voltage to a second terminal of the motor, the first and second voltages being different to cause the motor to be in a dynamic state; and
repeating said measuring and determining if a short circuit exists at the motor while in the dynamic state.

12. The system according to claim 10, wherein said determining if a short circuit exists includes determining if at least one measured voltage is below or above a threshold voltage.

13. The system according to claim 10, further comprising:
after determining if a short circuit exists while the motor is in the static state, applying a first voltage on a first terminal of the motor and a second voltage to a second terminal of the motor, the first and second voltages being different;
measuring voltages at the terminals of the motor and
determining if an open circuit exists at the motor based on the measured voltages.

14. A method for determining if an electrical problem exists at a motor of a vehicle, said method comprising:
applying a first voltage to a conductor connected to a first terminal of the motor;
applying a second voltage to a conductor connected to a second terminal of the motor, said first and second voltages being applied to the terminal of the motor causing the motor to be in a dynamic state;
measuring a voltage on at least one of the conductors connected to the first and second terminals of the motor; and
determining if a short circuit exists based on the measurement of the voltage on the at least one conductor.

15. The method according to claim 14, wherein applying the first and second voltages includes applying the voltages prior to activating the motor in response to a driver or passenger attempting to activate the motor.

16. The method according to claim 14, further comprising:
prior to applying the first and second voltages to the terminals of the motor, applying a bias voltage to the terminals to cause the motor to be in a static state;
measuring at least one second voltage at the terminals; and
based on said measurement of one second voltage, determining whether a short circuit exists while the motor is in the static state.

17. The method according to claim 16, further comprising:
after applying the bias voltage to the terminals, applying a reference voltage to one of the terminals, wherein the reference voltage is different from the bias voltage;
measuring the voltages on the terminals; and
determining if an open circuit exists at the motor based on the measured voltages.

18. The method according to claim 16, wherein applying the bias voltage is performed prior to activating the motor.

* * * * *